United States Patent [19]

Shou et al.

[11] Patent Number: 5,495,192

[45] Date of Patent: Feb. 27, 1996

[54] SAMPLE HOLD CIRCUIT

[75] Inventors: Guoliang Shou, Tokyo; Weikang Yang, Tokyo; Sunao Takatori, Tokyo; Makoto Yamamoto, Tokyo, all of Japan

[73] Assignee: Yozan Inc., Tokyo, Japan

[21] Appl. No.: 487,972

[22] Filed: Jun. 7, 1995

Related U.S. Application Data

[63] Continuation of Ser. No. 194,449, Feb. 9, 1994, abandoned.

[30] Foreign Application Priority Data

Feb. 10, 1992 [JP] Japan .................................. 5-045900

[51] Int. Cl.$^6$ .................................................. G11C 27/02
[52] U.S. Cl. .............................. 327/94; 327/91; 327/124
[58] Field of Search ............................ 307/353, 352, 307/350; 328/151, 162, 163, 127; 327/94, 95, 96, 91, 124

[56] References Cited

U.S. PATENT DOCUMENTS

| | | | |
|---|---|---|---|
| 4,546,324 | 10/1985 | Bingham et al. | 330/9 |
| 4,743,872 | 5/1988 | Tanimoto | 327/554 |
| 4,764,689 | 8/1988 | Thommen | 307/353 |
| 4,835,482 | 5/1989 | Tamakoshi et al. | 328/151 |
| 4,962,325 | 10/1990 | Miller et al. | 307/353 |
| 5,081,372 | 1/1992 | Polgrom | 307/353 |
| 5,142,236 | 8/1992 | Maloberti et al. | 307/353 |
| 5,144,160 | 9/1992 | Lee et al. | 307/353 |
| 5,252,956 | 10/1993 | Senn et al. | 307/353 |
| 5,281,860 | 1/1994 | Krenik et al. | 307/353 |

FOREIGN PATENT DOCUMENTS 60-89897  5/1985  Japan .................................. 307/353

OTHER PUBLICATIONS

Electrical Engineering Handbook, Editor-in-chief Richard C. Dorf, pp. 1726–1727 and 1735, CRC Press, 1993.

Primary Examiner—Timothy P. Callahan
Assistant Examiner—Kenneth B. Wells
Attorney, Agent, or Firm—Cushman, Darby & Cushman

[57] ABSTRACT

A sample and hold circuit to reduce hold error when analog data is held and transferred. The circuit includes a plurality of capacitors and inverters for guaranteeing level, selectively holds an input voltage at one capacitor by a first switching means, transfers charged voltage to a second capacitance by a second switching means and reduces data transfer time.

3 Claims, 5 Drawing Sheets

SAMPLE HOLD CIRCUIT

This is a continuation of application Ser. No. 08/194,449, filed on Feb. 9, 1994, which was abandoned upon the filing hereof.

FIELD OF THE INVENTION

The present invention relates to a sample and hold circuit for keeping sequential input data in sequential order.

BACKGROUND OF THE INVENTION

In a digital filter, a sample and hold circuit holds sequentially input data, and the multiplier data is accumulated. The held data is transferred to a sequential following sample hold circuit and input to a different multiplier.

Conventionally, in a digital filter, digital data is held and transferred, and a hold error may be ignored. On the other hand, analog calculation needs analog data, and a hold error can not be ignored. However, a sample and hold circuit for holding and transferring analog data is not known.

SUMMARY OF THE INVENTION

The present invention solves the conventional problems and provides a sample and hold circuit to limit hold error when analog data is held and transferred.

A sample and hold circuit according to the present invention uses a plurality of capacitors and inverters connected in parallel for guaranteeing level, selectively holds an input voltage at one capacitor by a first switching means, transfers charged voltage to a second capacitor by a second switching means, and reduces data transfer time.

PREFERRED EMBODIMENTS OF THE PRESENT INVENTION

Hereinafter an embodiment of a sample and hold circuit according to the present invention is described with referring to the attached drawings.

Figure 1:
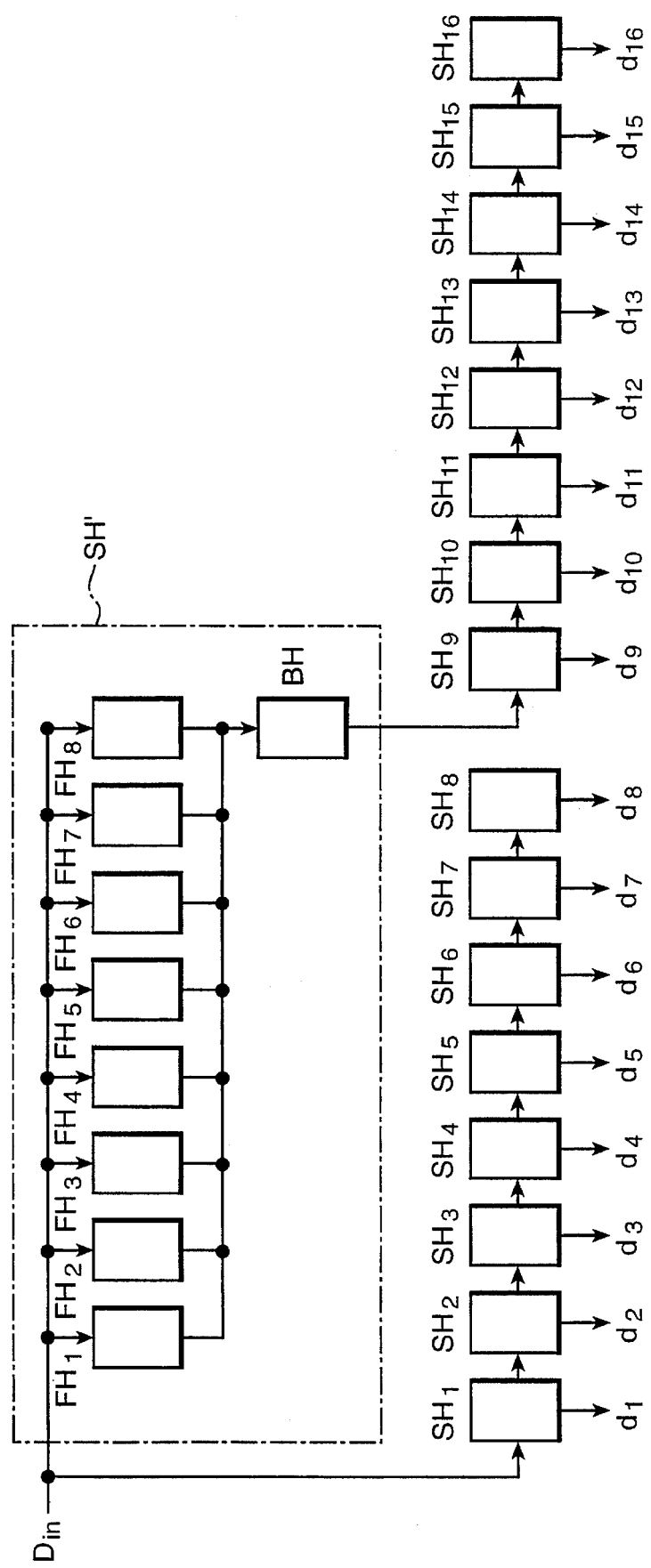
FIG. 1 is a schematic drawing showing an embodiment of a sample and hold circuit according to the present invention.

In FIG. 1, a sample and hold circuit has a plurality of the first sample and hold circuits SH1 to SH16, and second sample and hold circuits denoted generally as SH'. Circuits SH1 to SH8 and SH9 and SH16 are connected in parallel. An input voltage Din is input to SH1. Input voltage Din is also input to second sample and hold circuits FH1 to FH8. The outputs of second sample and hold circuits FH1–FH8 are connected to the input of sample and hold circuit BH, the output of which is input to circuit SH9.

Figure 2:
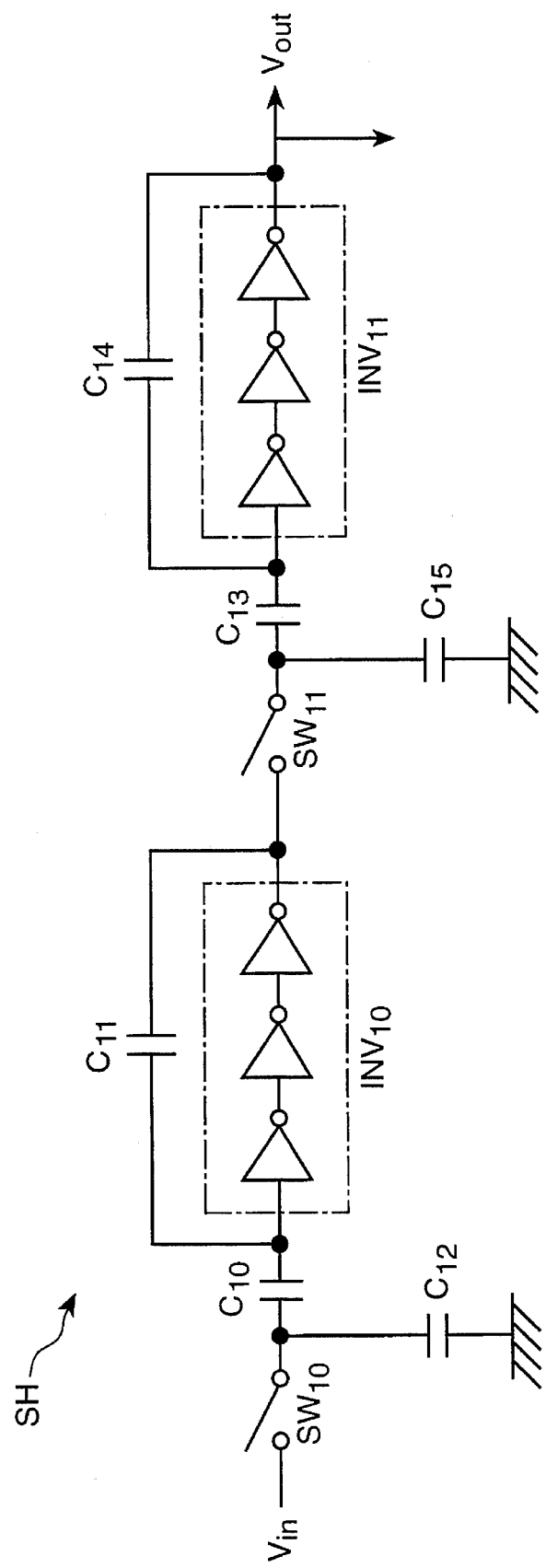
FIG. 2 shows an individual sample and hold portion of the circuit shown in FIG. 1.

FIG. 2 shows the composition of each of first sample and held circuits SH1 to SH16. Each sample and hold circuit SH1–SH16 includes switching means SW10, capacitor C10, inverter INV10, switching means SW11, capacitance C13, and inverter INV11. The outputs of INV10 and INV11 are fed back through capacitors C11 and C14, respectively. First SW10 is closed and SW11 is opened. Then voltage Vin connected with SW10 charges C10. The charged voltage of C10 is controlled by INV10 and C11 so that the output voltage of INV10 is equal to Vin. Grounded capacitor C12 is connected to a node between SW10 and C10 to compensate for deficiencies in the electric charge at high speed.

Then, a sample-hold operation of an input voltage Vin is executed. SW10 is opened and SW11 is closed, and C13 is charged by an output voltage of INV10. The charged voltage of C11 is controlled by INV11 and C14 so that the output voltage of INV11 is equal to the above Vin. At a node between SW11 and C13, grounded capacitor C15 is connected to compensate for deficiencies in the electric charge at high speed. An input voltage Vin is sampled and held once and then output as output voltage Vout at SH.

First sample and hold circuits SHi (i=1 to 8) work as above so as to transfer an input voltage Din (i=1) or an output voltage of the previous stage SHi−1 (i≧2), to the next stage SHi+1 after once performing a sample-hold operation, and generate output voltages di. First sample and hold circuits SHi (i=9 to 16) perform sample and hold operations on an output voltage of second sample and hold circuits shown as SH' (i=9) or an output voltage of the previous stage SHi−1 (i≧10), after once performing a sample-hold operation, to the next stage SHI+1, and generate output voltages di.

During the sample-hold operations described above, errors occur in the output of inverters INV10 and INV11 due to performance deviations of transistors incorporated within the inverters. When data is sequentially transferred, errors are integrated and extended.

In order to prevent the integrated error from exceeding a tolerable value, Din is transferred from SH1 to SH8. From SH9 to SH16, Din is input through second sample and hold circuits SH'.

Second sample and hold circuits SH' include a plurality of front hold portions FH1 to FH8 connected in parallel to Din and a back hold portion BH commonly connected to the output side.

Figure 3:
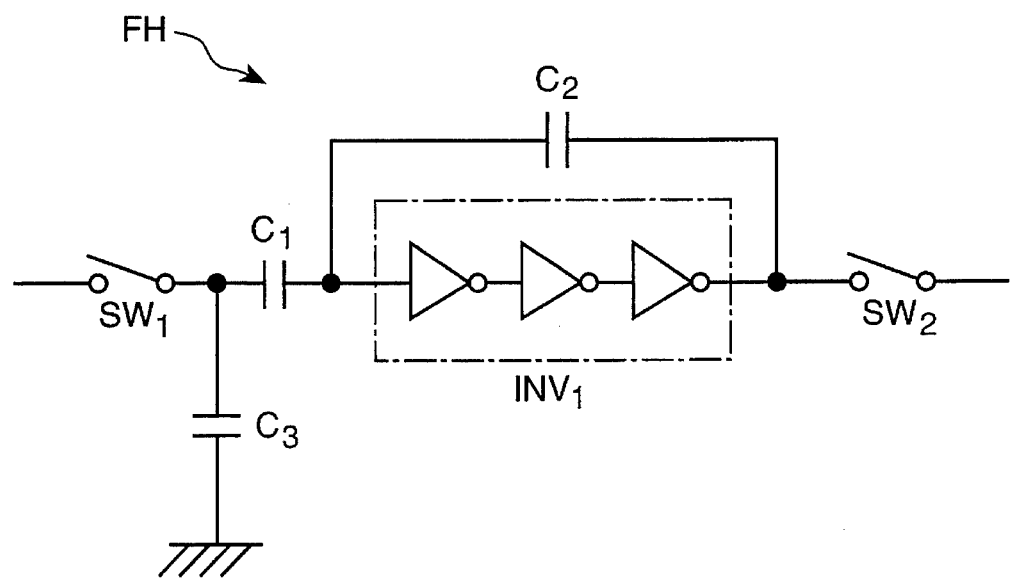
FIG. 3 shows the front holding portion of the circuit shown in FIG. 1.

FIG. 3 shows the details of FH1 to FH8, denoted generally as FH. FH includes switching means SW1, capacitor C1, inverter INV1 and switching means SW2 connected in series. The output of INV1 is fed back to the input through capacitor C2. SW1 is closed, then C1 is charged by Din. The charged voltage of C1 is controlled by INV1 and C2 so that the output voltage of INV1 is equal to Din. Between SW1 and C1, grounded capacitor C3 is connected to compensate for deficiencies in the electric charge at high speed.

The sample and hold operation of input voltage Din is executed as FH1→FH2→FH3→FH4→FH5→FH6→FH7→FH8→FH1 in a circular manner. SW2 is open in certain of the forward hold circuits, keeping the top data, that is the oldest data, in FH1 to FH8. At other forward hold circuits, SW2 is closed. Then, Din is output by BH by 7 clock delay.

Figure 4:
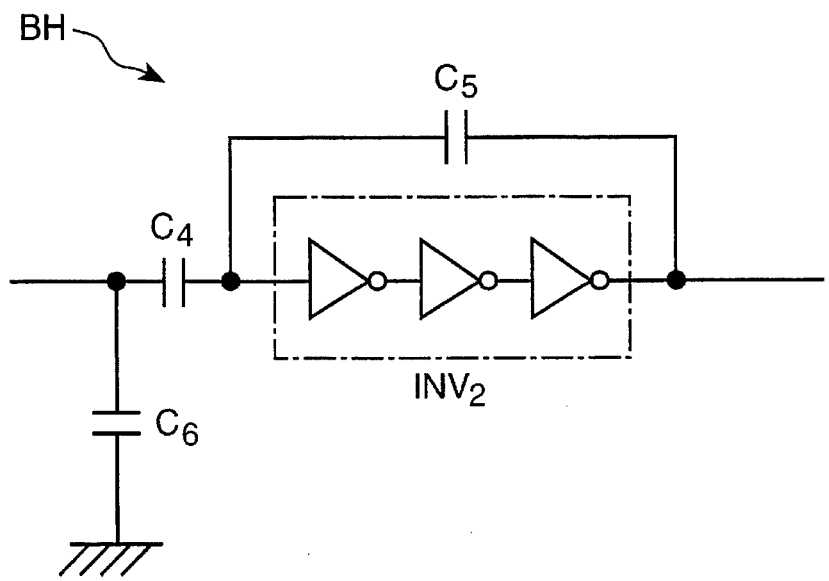
FIG. 4 shows the back holding portion of the circuit shown in FIG. 1.

BH is composed as shown in FIG. 4, includes capacitor C4 and inverter INV2 connected in series, and the output of INV2 is fed back to the input through capacitor C5. One of forward hold circuits FH, when SW2 is closed, charges C4 by an output voltage INV1. The charged voltage of C4 is controlled by INV2 and C5 so that the output voltage of INV2 is equal to the output of INV1. Grounded capacitor C6 is connected at the front plate of C4 to compensate for deficiencies in electric charge at high speed.

Voltage held at BH is transferred to SH9, and Din is transferred to SH9 the next time Din is transferred to SH8. Thus, this arrangement is equivalent to serially connecting SH1 to SH16. However, only one transfer is performed from FHi to BH at SH', so the hold error is decreased as compared to SH1 to SH8.

As mentioned above, it is possible to maintain the accuracy of d1 to d16 by dividing the sample and hold circuits into two stages and transferring data to the second stage through SH'.

Figure 5:
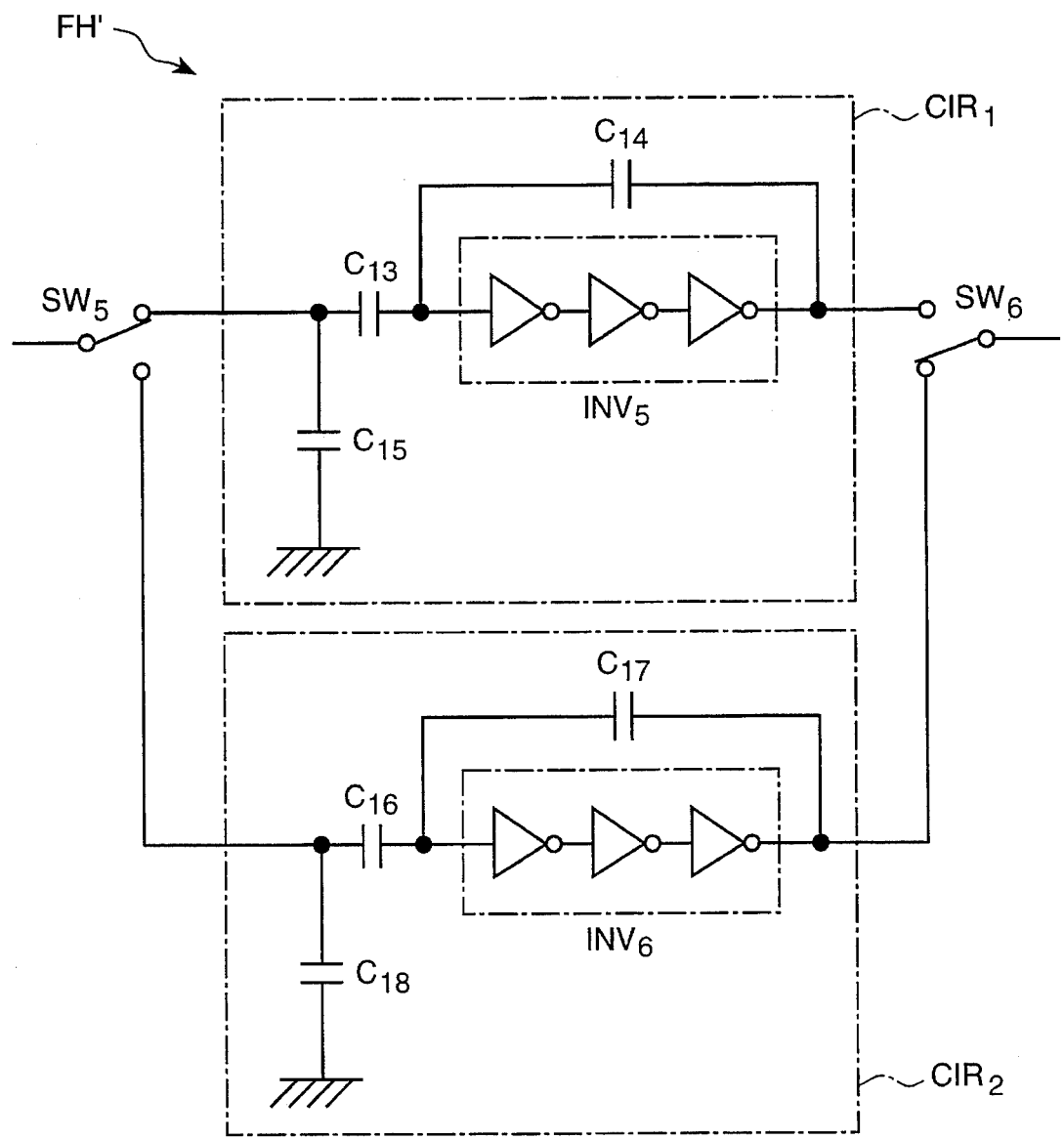
FIG. 5 is a circuit showing a second embodiment of the front holding portion of the circuit shown in FIG. 1.

Hereinafter the second embodiment of a front hold circuit FH' is shown. In FIG. 5, FH' includes circuits CIR1 and CIR2. In CIR1, capacitor C13, and inverter INV5 are connected in series, and the output of INV5 is fed back to its input through capacitor C14. CIR2 includes capacitor C16 and inverter INV6 connected in series, and the output of INV6 is fed back to the input through capacitor C17.

There are switching means SW5 and SW6. SW5 selects one of circuits (CIR1 or CIR2) for the input and SW6 selects one of them for the output. One of the circuits executes a sample hold while the other is outputting data. Then it is possible to perform sample and hold operations and to generate output at high speed.

Figure 6:
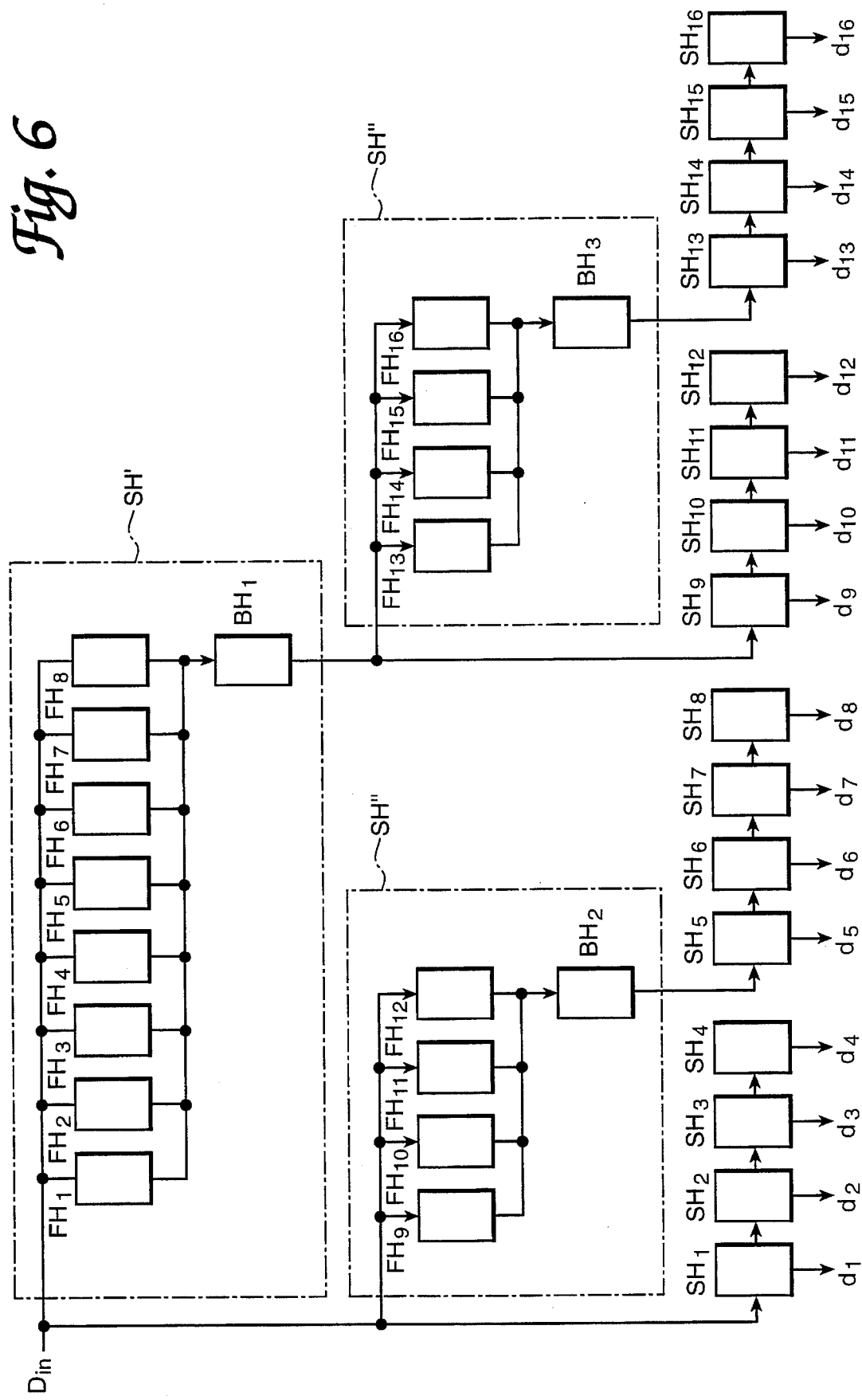
FIG. 6 is a schematic drawing showing a second embodiment of the sample and hold circuit according to the present invention.

FIG. 6 shows another embodiment of the circuit of FIG. 1. In the circuit, SH1 to SH16 are divided into 4 sets. SH1 to SH4 directly transfer Din input, and SH9 to SH12 transfer Din through SH' as FIG. 1. SH5 to SH8 transfer Din received through one of two circuits designated SH", each of which includes 4 front hold circuits. SH13 to SH16 transfers Din through SH' and the other of the two circuits designated SH". Then the maximum value of the number of transfer stages is half that of the circuit of FIG. 1, and hold error can be further decreased.

As mentioned above, a sample and hold circuit according to the present invention includes a plurality of capacitors and inverters connected in parallel for compensating level, and selectively limits an input voltage to one of the capacitors by a switching means. The charge of one capacitor is transferred by switching means to a back stage to limit data transfer, to limit hold error.

What is claimed is:

1. A sample and hold circuit comprising:
    a first sample and hold circuit for receiving an input voltage, said first sample and hold circuit comprising:
        a plurality of sampling circuits, each of said sampling circuits including a first switch for selectively supplying said input voltage to a corresponding one of said sampling circuits, a first inverter having an input and an output, a first capacitance connected between said input of said first inverter and said first switch, a first feedback capacitance connecting said output of said first inverter to said input of said first inverter, and a second switch, for selectively connecting said output of said first inverter to an output node, said output node connecting outputs from all sample circuits, and
        an output circuit including a second inverter having an input and an output, an output capacitance connected between said output node and said second inverter input, and a second feedback capacitance connecting said output of said second inverter to said input of said second inverter;
    a plurality of second sample and hold circuits connected in series, a first one of said second sample and hold circuits being connected in parallel with said first sample and hold circuit to said input voltage, each second sample and hold circuit comprising a third switch, a third capacitance, a third inverter, a fourth switch, a fourth capacitance and a fourth inverter connected in series, each second sample and hold circuit further comprising a third feedback capacitance for connecting an output to an input of said third inverter and a fourth feedback capacitance for connecting an output to an input of said third inverter; and
    a plurality of third sample and hold circuits connected in series, a first one of said third sample and hold circuits being connected to an output of said first sample and hold circuit, each third sample and hold circuit comprising a fifth switch, a fifth capacitance, a fifth inverter, a sixth switch, a sixth capacitance and a sixth inverter connected in series, each third sample and hold circuit further comprising a fifth feedback capacitance for connecting said output to said input of said fifth inverter and a sixth feedback capacitance for connecting said output to said input of said sixth inverter.

2. The sample and hold circuit of claim 1, further comprising a plurality of first grounding capacitances, each of said first grounding capacitances being connected between an input terminal of one of said third capacitances and ground, and between an input terminal of one of said fifth capacitances and said ground, respectively.

3. The sample and hold circuit of claim 2, further comprising a plurality of second grounding capacitances, each connected between an input terminal of one of said fourth capacitances and said ground, and between an input terminal of one of said sixth capacitance and said ground, respectively.

* * * * *